United States Patent
Chen

(10) Patent No.: US 9,583,439 B1
(45) Date of Patent: Feb. 28, 2017

(54) MEMORY DEVICE COMPRISING MEMORY STRINGS PENETRATING THROUGH A STACKING STRUCTURE AND ELECTRICALLY CONTACTING WITH A METAL LAYER AND METHOD FOR FABRICATING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/821,874

(22) Filed: Aug. 10, 2015

(51) Int. Cl.
   *H01L 23/528* (2006.01)
   *H01L 27/115* (2006.01)

(52) U.S. Cl.
   CPC ...... *H01L 23/5286* (2013.01); *H01L 27/1157* (2013.01); *H01L 27/11582* (2013.01)

(58) Field of Classification Search
   CPC ........... H01L 23/5286; H01L 27/11524; H01L 27/11529; H01L 27/1157; H01L 27/11528
   See application file for complete search history.

(56) References Cited

U.S. PATENT DOCUMENTS

| | | |
|---|---|---|
| 2012/0205722 A1 | 8/2012 | Lee et al. |
| 2012/0276696 A1* | 11/2012 | Yang ............... H01L 27/11556 438/156 |
| 2014/0175532 A1 | 6/2014 | Chen |

OTHER PUBLICATIONS

TW Office Action dated Oct. 19, 2016 in Taiwan application (No. 104126174).

* cited by examiner

*Primary Examiner* — Hoai V Pham
(74) *Attorney, Agent, or Firm* — McClure, Qualey & Rodack, LLP

(57) ABSTRACT

A memory device and a method for fabricating the same are provided. The memory device includes a substrate, a ground layer disposed on the substrate, a stacking structure having a plurality of conductive layers and a plurality of insulating layers alternatively stacked on the ground layer and a plurality of memory strings penetrating through the stacking structure. The ground layer includes a metal layer. The memory strings electrically contact with the metal layer.

9 Claims, 16 Drawing Sheets

MEMORY DEVICE COMPRISING MEMORY STRINGS PENETRATING THROUGH A STACKING STRUCTURE AND ELECTRICALLY CONTACTING WITH A METAL LAYER AND METHOD FOR FABRICATING THE SAME

BACKGROUND

Technical Field

The disclosure in generally relates to a semiconductor structure and method for fabricating the same, and more particularly to a memory device and method for fabricating the same.

Description of the Related Art

Recently, there is an increasing need for the more excellent memory device, and various types of the three-dimensional (3D) memory devices are provided, such as a surrounding-gate vertical-channel (SGVC) 3D NAND memory device having a multi-layer structure. This type of the 3D memory device can achieve higher storage capacity and has more excellent electrical characteristics, for example, having better data retention reliability and higher operating speed.

The typical SGVC 3D NAND memory device includes a plurality of stacking structures having a plurality of insulating layers and a plurality of conducting layers alternatively stacked on a substrate, and a plurality of memory layers and a plurality of channel layers longitudinally penetrating through the stacking structures. The intersections of each of the channel layers and each of the memory layers define the NAND memory cells. The NAND memory cells are connected by the channel layers to form NAND memory strings. The NAND memory strings electrically contact with the ground layer under the stacking structure through the ground selecting line (GSL) transistor.

Since the conventional ground layer is formed of the poly-silicon material, the resistance is relatively higher, and it is easy to produce the IR drop effect. To improve this drawback, metal contact structures are generally disposed between the memory blocks longitudinally penetrating through the stacking structure, to guide the current to the ground. However, the arrangement of the metal contact structures compresses the layout space of the memory strings, and further reduces the storage space of the SGVC 3D NAND memory device.

Therefore, there is a need of providing an improved memory device and method for fabricating the same to obviate the drawbacks encountered from the prior art.

SUMMARY

A memory device and a method for fabricating the same are provided in the present disclosure, to resolve a least a portion of the above problems.

According to an embodiment of the present invention, a memory device comprises a substrate, a ground layer disposed on the substrate, a stacking structure having a plurality of insulating layers and a plurality of conducting layers alternatively stacked on the ground layer, and a plurality of memory strings. The ground layer includes a metal layer. The memory strings penetrate through the stacking structure and electrically contact with the metal layer.

According to an embodiment of the present invention, the ground layer of the memory device is a multi-layer structure. The ground layer may further include a semiconductor layer disposed on the metal layer.

According to an embodiment of the present invention, a method for fabricating the memory device comprises the following steps. Firstly, a first sacrifice layer and a stacking structure are sequentially formed on a substrate. The stacking structure comprises a plurality of second sacrifice layers and a plurality of insulating layers alternatively stacked on the first sacrifice layer. Secondly, a plurality of string openings are formed penetrating through the stacking structure to expose a portion of the first sacrifice layer. Next, a plurality of the memory layers and a plurality of channel layers are sequentially formed on a plurality of sidewalls of the string openings to make each of the channel layers connected to one of the memory layers and in contact with the first sacrifice layer. Then, the first sacrifice layer and the second sacrifice layer are removed. Thereafter, a metal material is filled to form a plurality of conducting layers disposed between the insulating layers and to form a metal layer disposed between the stacking structure and the substrate. The conducting layers are ad to each of the memory layers and the metal layer electrically contacts with the channel layer.

According to an embodiment of the present invention, before the forming of the stacking structure, the method for fabricating the memory device further comprises forming a semiconductor layer disposed on the first sacrifice layer.

BRIEF DESCRIPTION OF THE DRAWINGS

The above objects and advantages of the present invention will become more readily apparent to those ordinarily skilled in the art after reviewing the following detailed description and accompanying drawings, in which.

Figure 1:
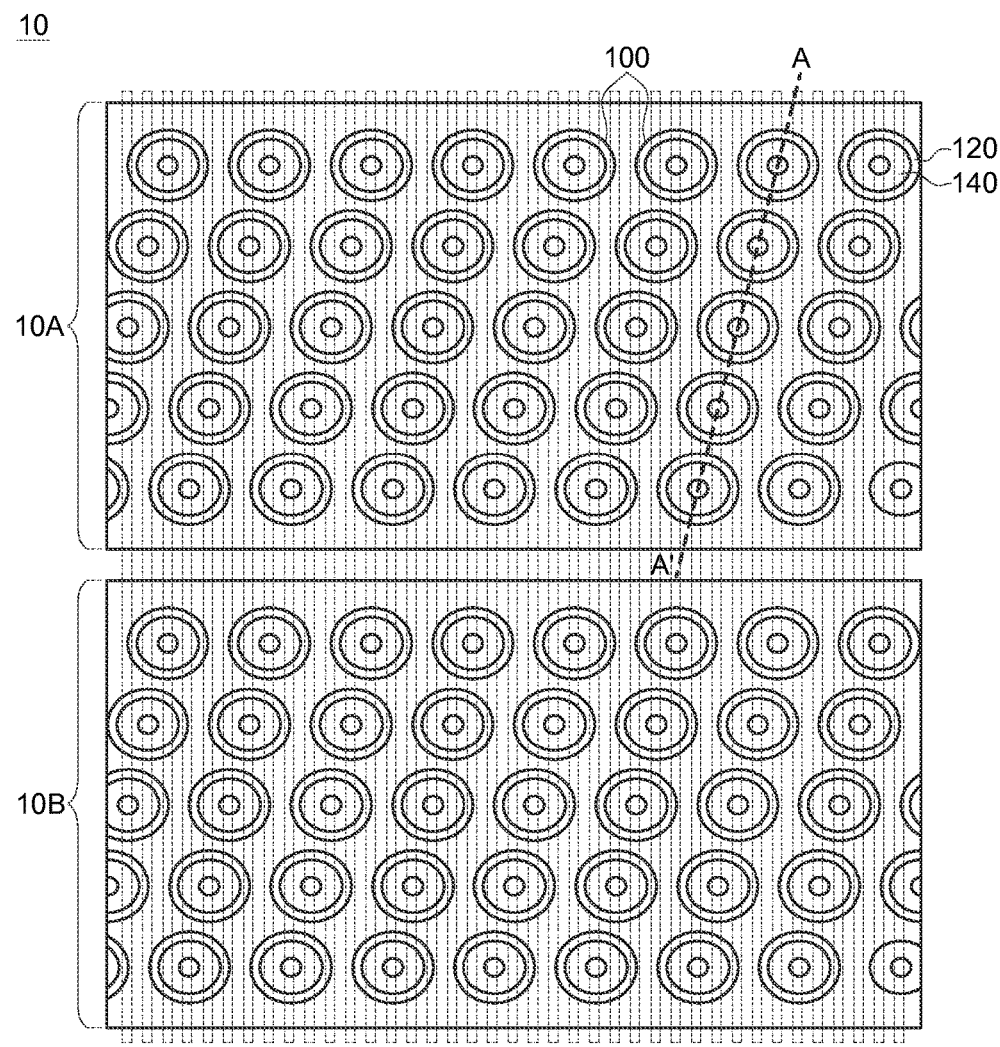
FIG. 1 is a top view illustrating a memory device in accordance with one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to a memory device and a method for fabricating the same. For purposes of explanation, the following embodiments will be exemplarily focused on a 3D memory device, such as a 3D vertical channel memory device. However, this invention is not limited thereto. For example, the memory device and the method for fabricating the same may be applied in other non-volatile memory, general memory, or general semiconductor structures.

Figure 2:
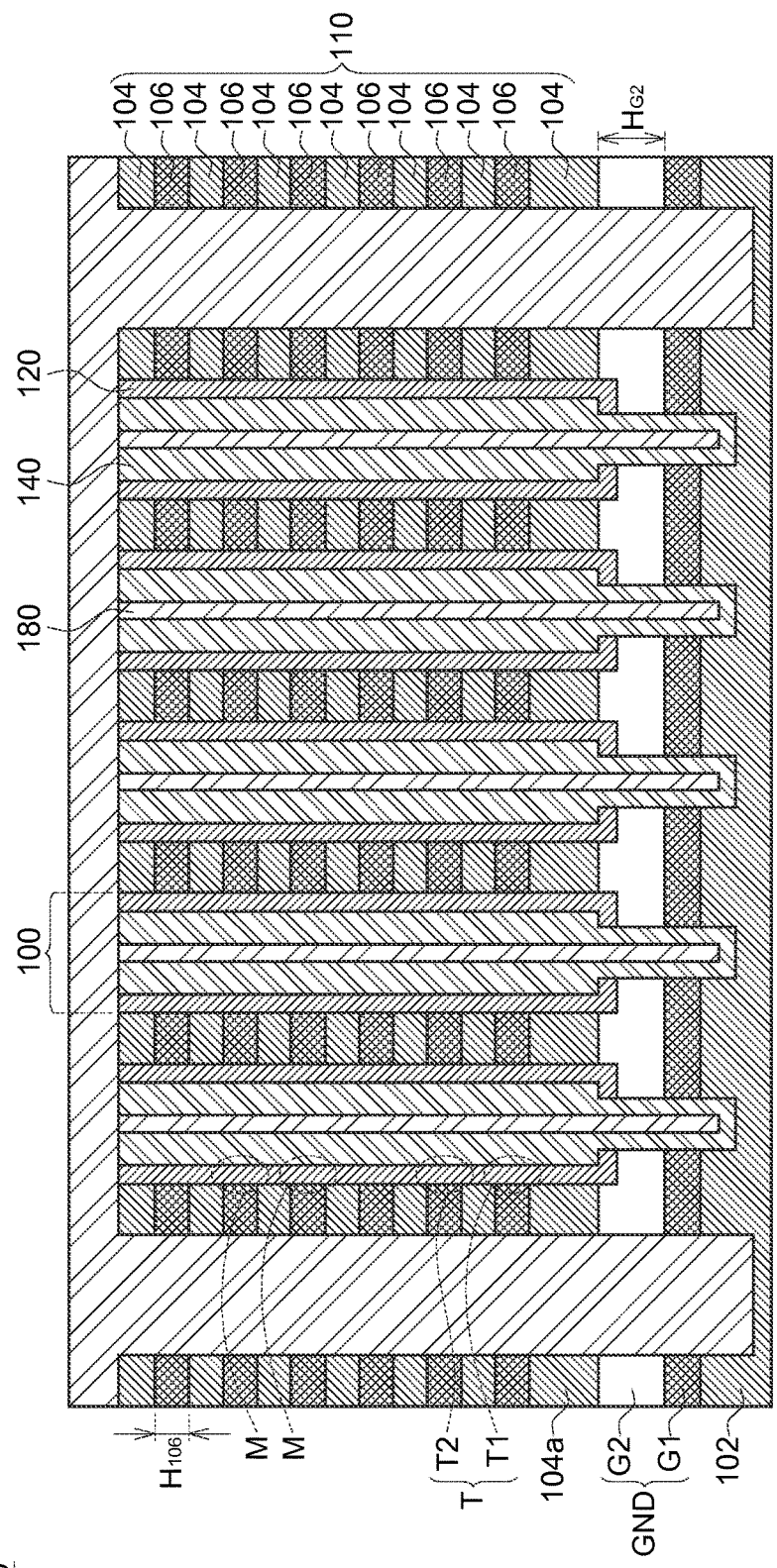
FIG. 2 is a cross-section view illustrating a memory device taken along with the line A-A' depicted in the FIG. 1 in accordance with one embodiment of the present invention.

Referring to FIG. 1 and FIG. 2, FIG. 1 is a top view illustrating a memory device 10 in accordance with one embodiment of the present invention, and FIG. 2 is a cross-section view illustrating the memory device 10 taken along with the line A-A' depicted in the FIG. 1 in accordance with one embodiment of the present invention.

The memory device 10 comprises a substrate 102, a ground layer GND on the substrate 102, a stacking structure 110 having a plurality of insulating layers 104 and a plurality of conducting layers 106 alternatively stacked on the ground layer GND, and a plurality of memory strings 100. The ground layer GND includes a metal layer G1. The memory strings 100 penetrate through the stacking structure 110 and electrically contact with the metal layer G1. In some embodiments of the present invention, the memory device 10 can be separated into blocks 10A and 10B by arranging the memory strings 100 into a plurality of subsets.

In the memory device 10 according to an embodiment of the present invention, the current of the memory cells M can be directly gathered to the metal layer G1, because the memory strings 100 penetrate through the stacking structure 110 and electrically contact with the metal layer G1. Moreover, since the metal layer G1 has a low resistance, the formation of the IR drop effect can be avoided. Therefore, the arrangement of the metal contacts between the memory blocks can be decreased, so that the layout space of the memory strings can be increased, and the storage space of a SGVC 3D NAND memory device can further be increased.

In some embodiments, each of the memory strings 100 comprises a memory layer 120, a channel layer 140 and a plurality of memory cells M. The memory layer 120 penetrates through the stacking structure 110 to connect to the conducting layer 106. The channel layer 140 is connected to memory layer 120 and electrically contacts with the metal layer G1. The memory cells M are formed at the intersections of the conducting layers 106 and the memory layer 120, and are connected to each other by the channel layer 140.

In some embodiments, the substrate 102 and the insulating layer 104 can be formed of an oxide, such as silicon dioxide ($SiO_2$).

In some embodiments, the conducting layer 106 and the metal layer G1 can be formed of the same conductive material, such as tungsten (W) or titanium nitride (TiN).

In some embodiments, the channel layer 140 can be formed of the semiconductor material, such as a doped or un-doped poly-silicon. The memory layer 120 can be formed of a composite layer (i.e., an ONO layer) including a silicon oxide layer, a silicon nitride layer, and a silicon oxide layer.

In some embodiments, since the ground layer GND has the metal layer G1, the contact area between the metal layer G1 and the channel layer 140 can produce a schottky barrier, and it may have a negative impact on the stability of the contact resistance. Therefore, the ground layer GND can be optionally designed as a multi-layer structure. A semiconductor layer G2 can be disposed on the metal layer G1, so that the semiconductor layer G2 can help gathering the current of the memory cells M to the metal layer G1, to improve the stability of the contact resistance.

For example, in the present embodiment, the ground layer GND can be a multi-layer structure. The ground layer GND further includes a semiconductor layer G2 on the metal layer G1. The conductivity of the metal layer G1 is higher than that of the semiconductor layer G2. The thickness $H_{G2}$ of the semiconductor layer G2 is larger than the thickness $H_{106}$ of each of the conducting layers 106, wherein the semiconductor layer G2 can be a heavily doped poly-silicon layer. For example, the doping concentration of the heavily doped poly-silicon layer can be substantially larger than $10^{20}/cm^3$. Moreover, the heavily doped poly-silicon layer can be doped with a p type or an n type dopant.

In some embodiments, each of the memory strings 100 includes at least one ground selecting line GSL disposed between the conducting layers 106 and the ground layer GND, and at least a ground selecting line transistor T disposed between the memory cells and the ground layer GND.

In some embodiments, each of the memory strings 100 includes a plurality of ground selecting lines GSL and a plurality of ground selecting line transistor T. For example, in the present embodiment, the conducting layer 106 closest to the ground layer GND can be selected as the ground selecting lines (hereinafter, the ground selecting lines GSL1 and GSL2), and the memory cells M defined by the ground selecting lines GSL1 and GSL 2 and the channel layers 140 and the memory layers 120 can be functioned as ground selecting line transistors (hereinafter, the ground selecting line transistors T1 and T2). In the present embodiment, the ground selecting line transistors T1 and T2 are disposed between the other memory cells M and the ground layer GND, and the ground selecting line transistors T1 and T2 are subjected to different voltages.

For the reason that the semiconductor layer G2 can be a heavily doped poly-silicon layer, the dopant can be diffused to the channel layer 140, and it further results in the current leakage of the ground selecting lines GSL. By the arrangement of a plurality of the ground selecting lines, such as GSL1 and GSL2, and a plurality of the ground selecting line transistors T1 and T2 subjected to different voltages, there can be more selectivity for controlling the current, and the problems of the increase of the power consumption resulted from the current leakage by the arrangement of a single ground selecting line can be avoided.

In some embodiments, the channel layer 140 can further penetrate through the ground layer GND, including the metal layer G1 and the semiconductor layer G2 in the present embodiment, and extend in the substrate 102. By the connection of the channel layer 140 penetrating through the stacking structure 110 and the ground select layer GND, the stacking structure 110 and the ground layer GND can be connected, and can be rooted and fixed in the substrate 102. Therefore, during the process of fabricating the memory device 10, especially after the etching process, it is not necessary to provide another supporting structure for support, and it can prevent the lift-off or the movement to the stacking structure 110 and the ground layer GND for lacking of the support.

By the arrangement of a bottom insulating layer 104a having a thickness larger than that of any one of the other insulating layer 104, the current leakage problems of the ground selecting line GSL resulted from the dopant diffused from the semiconductor G2 can be avoided. For example, in some embodiments, the insulating layers 104 have a bottom insulating layer 104a closest to the substrate 102, and a ratio of a thickness of the bottom insulating layer 104a to a thickness of any one of the other insulating layers 104 ranges from 1 to 3.

In some embodiments, the memory device 10 further comprises a dielectric material 180 filled in the channel layer 140 and covering the stacking structure 110. The dielectric material 180 can be an oxide, such as silicon dioxide ($SiO_2$).

FIG. 3A to 3M are cross-section views illustrating a method for fabricating a memory device in accordance with one embodiment of the present invention.

Figure 3A:
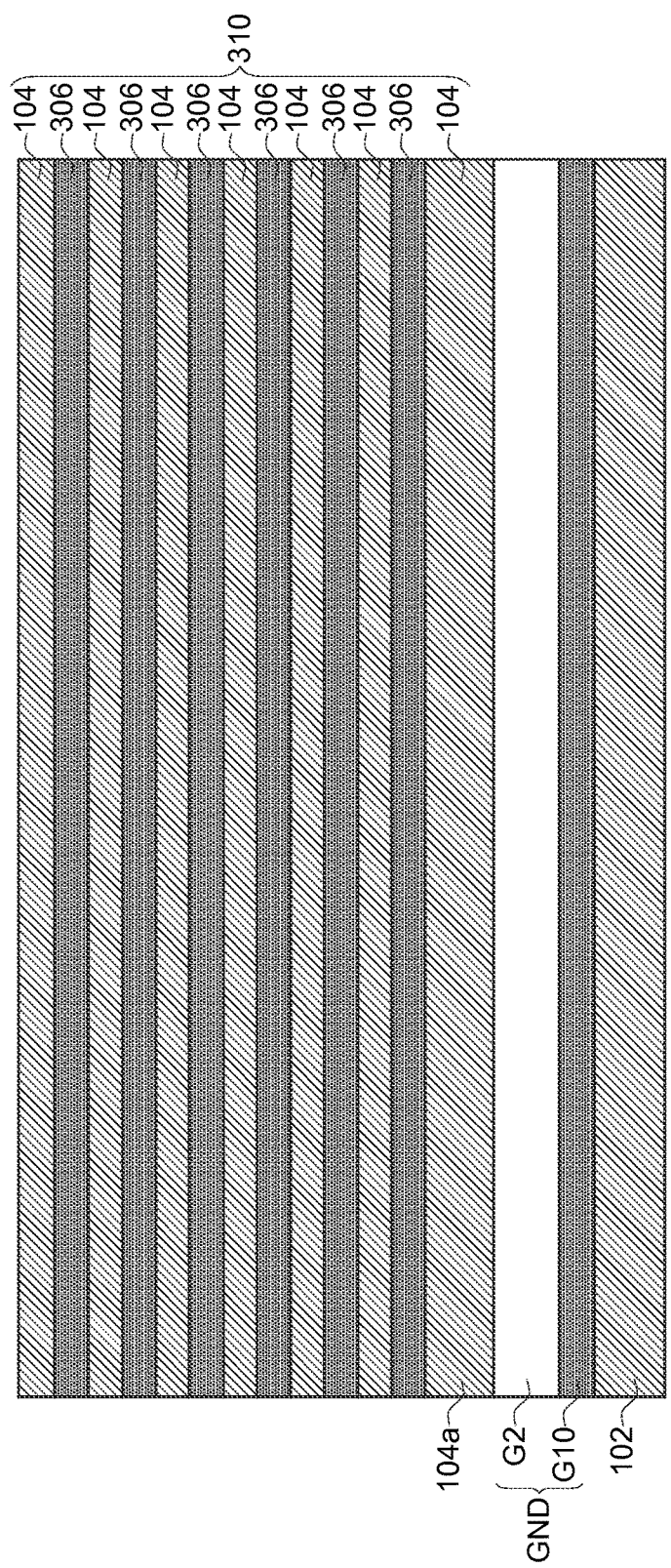
FIG. 3A to 3M are cross-section views illustrating a method for fabricating a memory device in accordance with one embodiment of the present invention.

Referring to FIG. 3A, a first sacrifice layer G10 and a stacking structure 310 are sequentially formed on a substrate 102. The stacking structure 310 comprises a plurality of second sacrifice layers 306 and a plurality of insulating layers 104 alternatively stacked on the first sacrifice layer G10.

In some embodiments, before the forming of the stacking structure 310, it further comprises a semiconductor layer G2 formed on the first sacrifice layer G10.

In some embodiments, the substrate 102 can be formed of silicon dioxide ($SiO_2$). The insulating layer 104 can be formed of silicon dioxide ($SiO_2$). The second sacrifice layer 306 and the first sacrifice layer G10 can be formed of silicon nitride (SiN).

In some embodiment, the semiconductor layer G2 can be a heavily doped poly-silicon layer having a doping concentration larger than $10^{20}/cm^3$.

In some embodiment, the insulating layers 104 have a bottom insulating layer 104a closest to the substrate 102, and a ratio of a thickness of the bottom insulating layer 104a to a thickness of any one of the other insulating layers 104 ranges from 1 to 3.

Figure 3B:
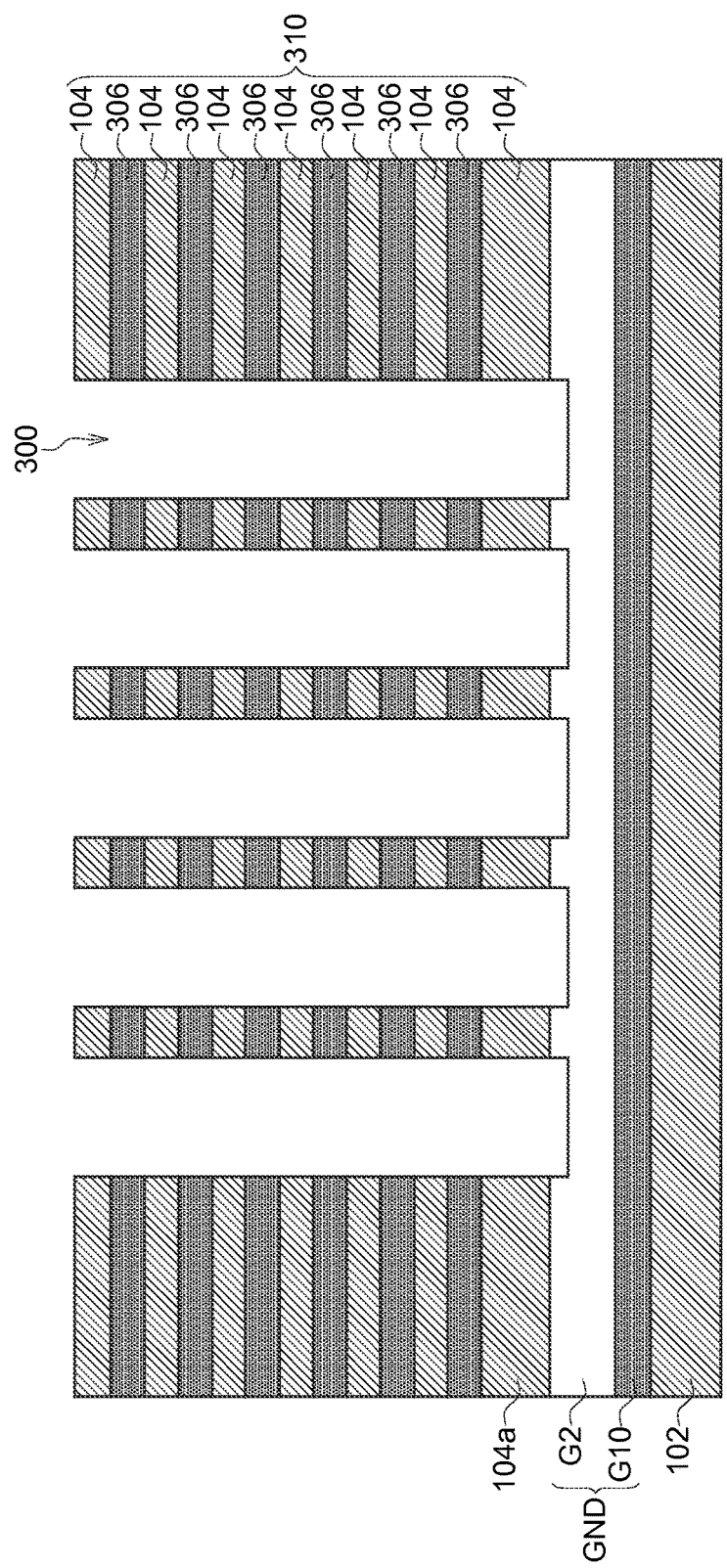

Referring to FIG. 3B, a plurality of string openings 300 are formed penetrating through the stacking structure 310 to expose a portion of the second sacrifice layer 306. In the present embodiment, the string openings 300 are formed penetrating through the stacking structure 310 to expose a portion of the semiconductor layer G2.

In some embodiments, the string openings 300 can be formed by an etching process, such as a dry etching method.

Figure 3C:
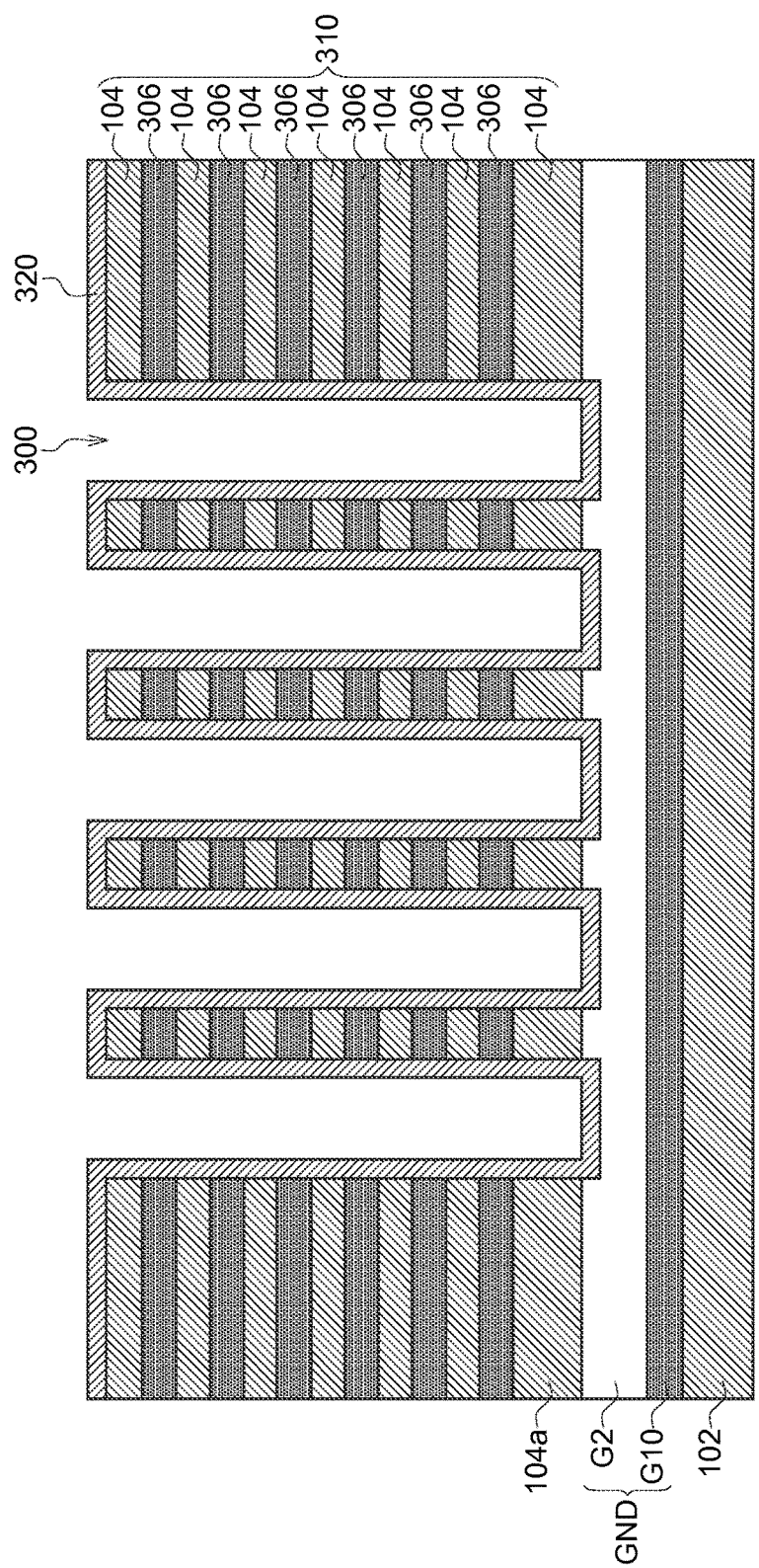

Referring to FIG. 3C, an oxide-nitride-oxide structure layer 320 conformally covers over the stacking structure 310 and the sidewalls of the string openings 300. That is, the oxide-nitride-oxide structure layer 320 is on the stacking structure 310 and in the string openings 300.

In some embodiments, the oxide-nitride-oxide structure layer 320 can be formed by a deposition process.

Figure 3D:
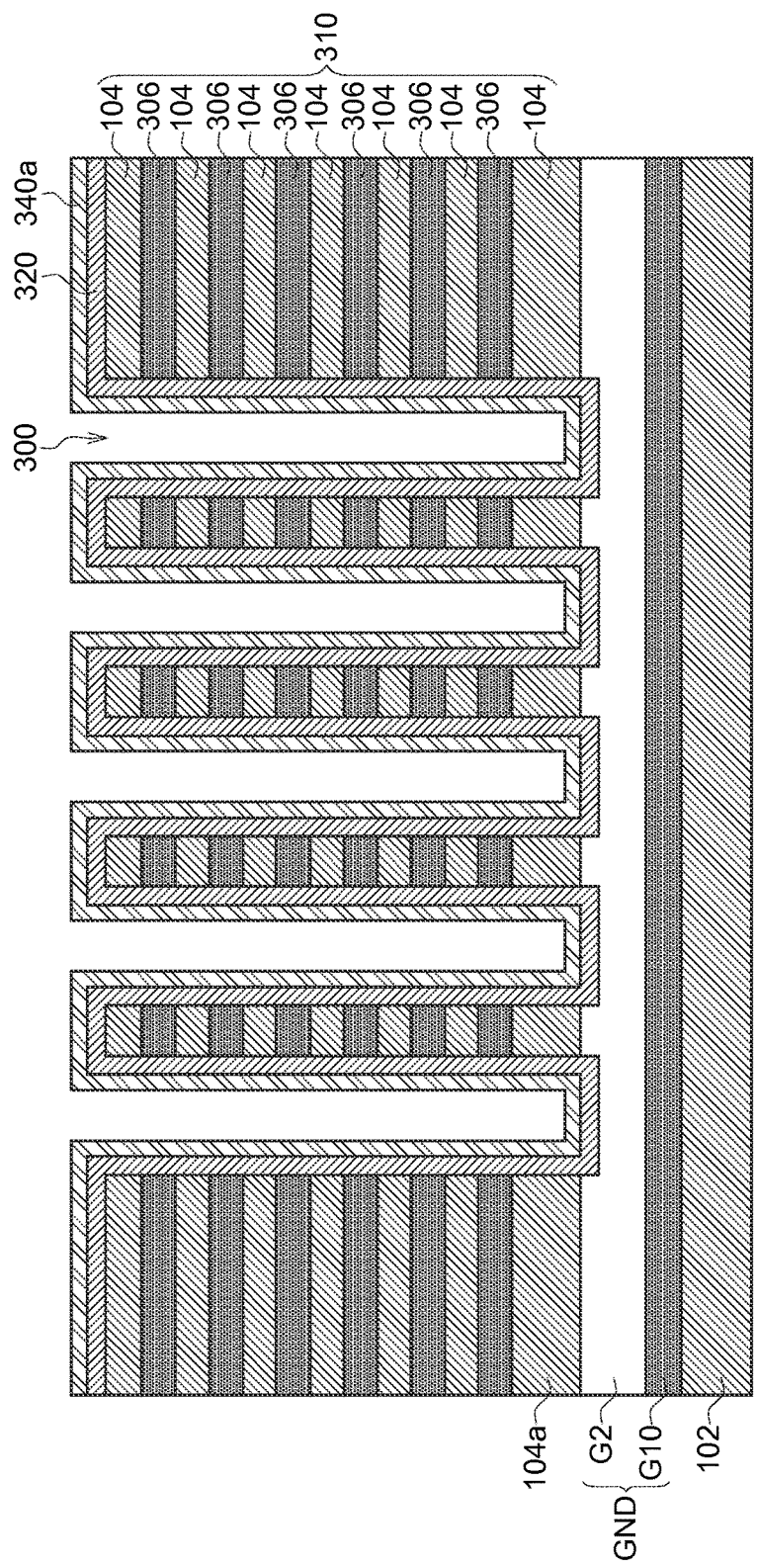

Referring to FIG. 3D, a poly-silicon covering layer 340a is formed on the oxide-nitride-oxide structure layer 320. The poly-silicon covering layer 340a can be formed of the un-doped poly-silicon material. The poly-silicon covering layer 340a can be formed by a deposition process.

Figure 3E:
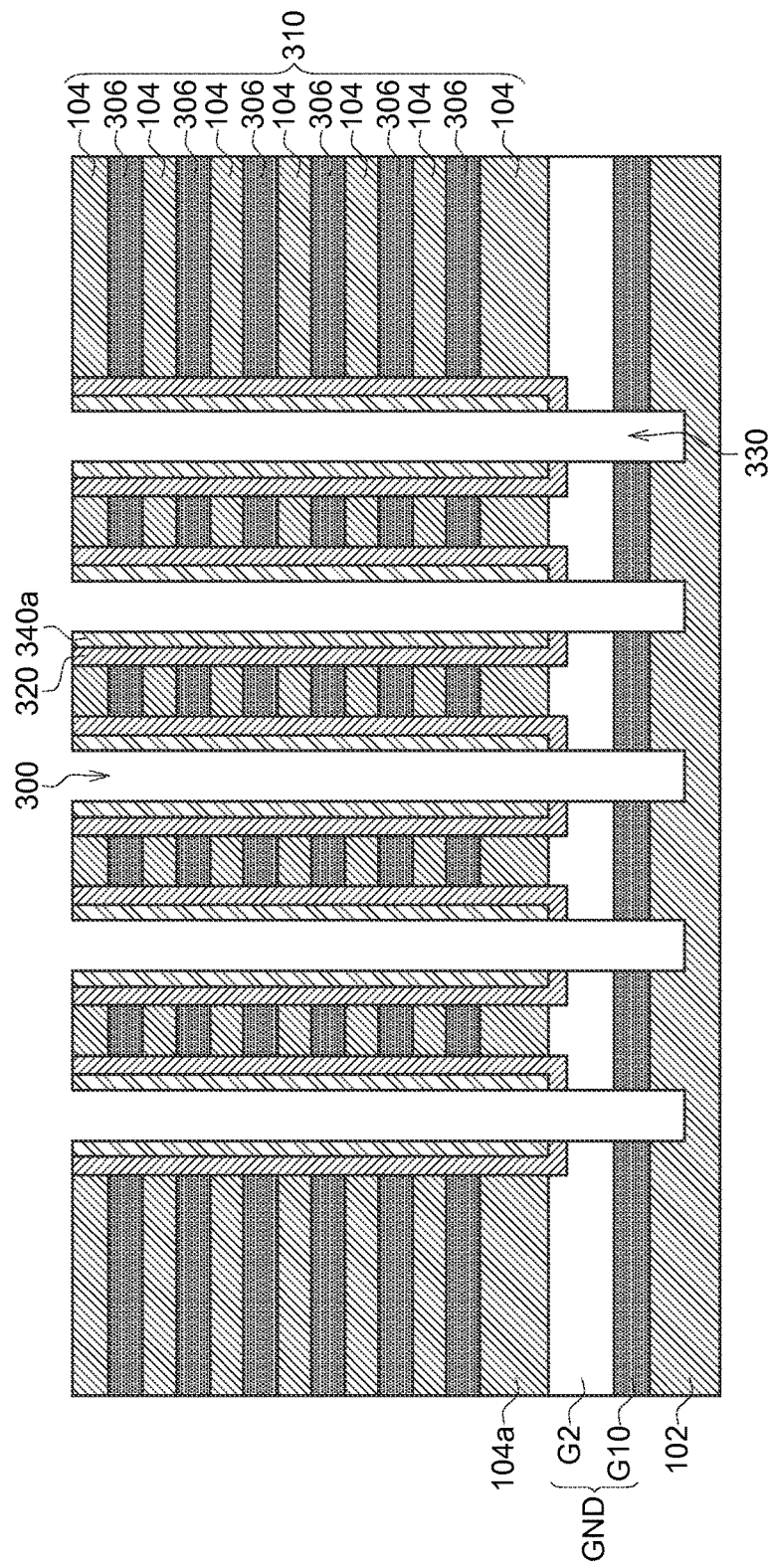

Referring to FIG. 3E, a portion of the oxide-nitride-oxide structure layer 320 and a portion of the poly-silicon covering layer 340a higher than the string openings 300 are removed. A via 330 is formed in each of the string openings 300 to expose a portion of the first sacrifice layer G10. The Via 330 extends through the first sacrifice layer G10 and exposes a portion of the substrate 102. The via 330 can be formed by an etching method, such as a dry etching method.

In some embodiment, the via 330 further exposes a portion of the semiconductor layer G2.

Figure 3F:
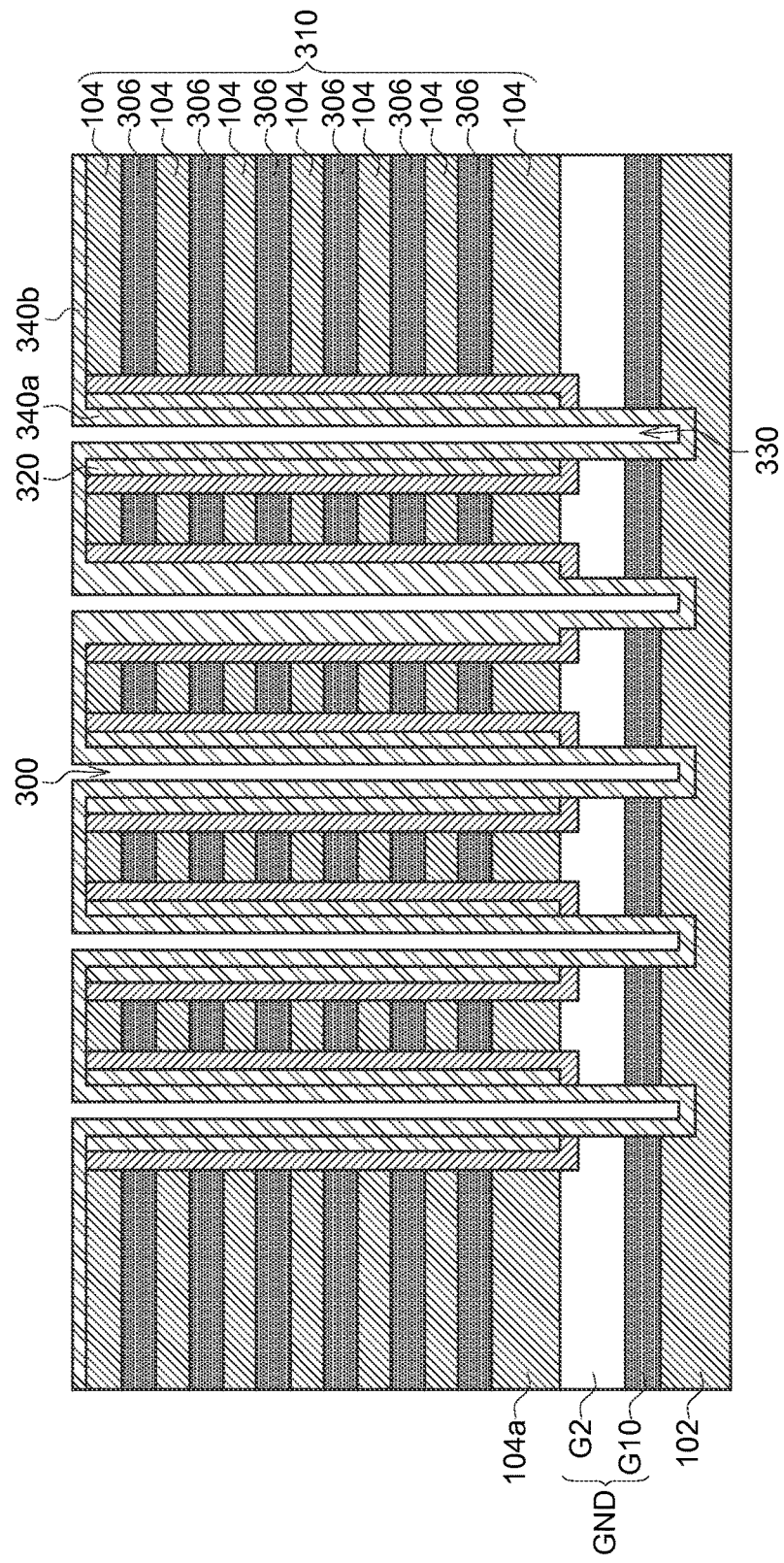

Referring to FIG. 3F, a poly-silicon layer 340b is formed in each of the string openings 300, so that the poly-silicon layer 340b contacts with the poly-silicon covering layer 340a and the first sacrifice layer G10. The poly-silicon layer 340b partially extends into the substrate 102.

In some embodiments, the poly-silicon layer 340b can be formed of an un-doped poly-silicon material. The poly-silicon covering layer 340a and the poly-silicon layer 340b can be formed of the same material. The poly-silicon layer 340b can be formed by a deposition process.

Figure 3G:
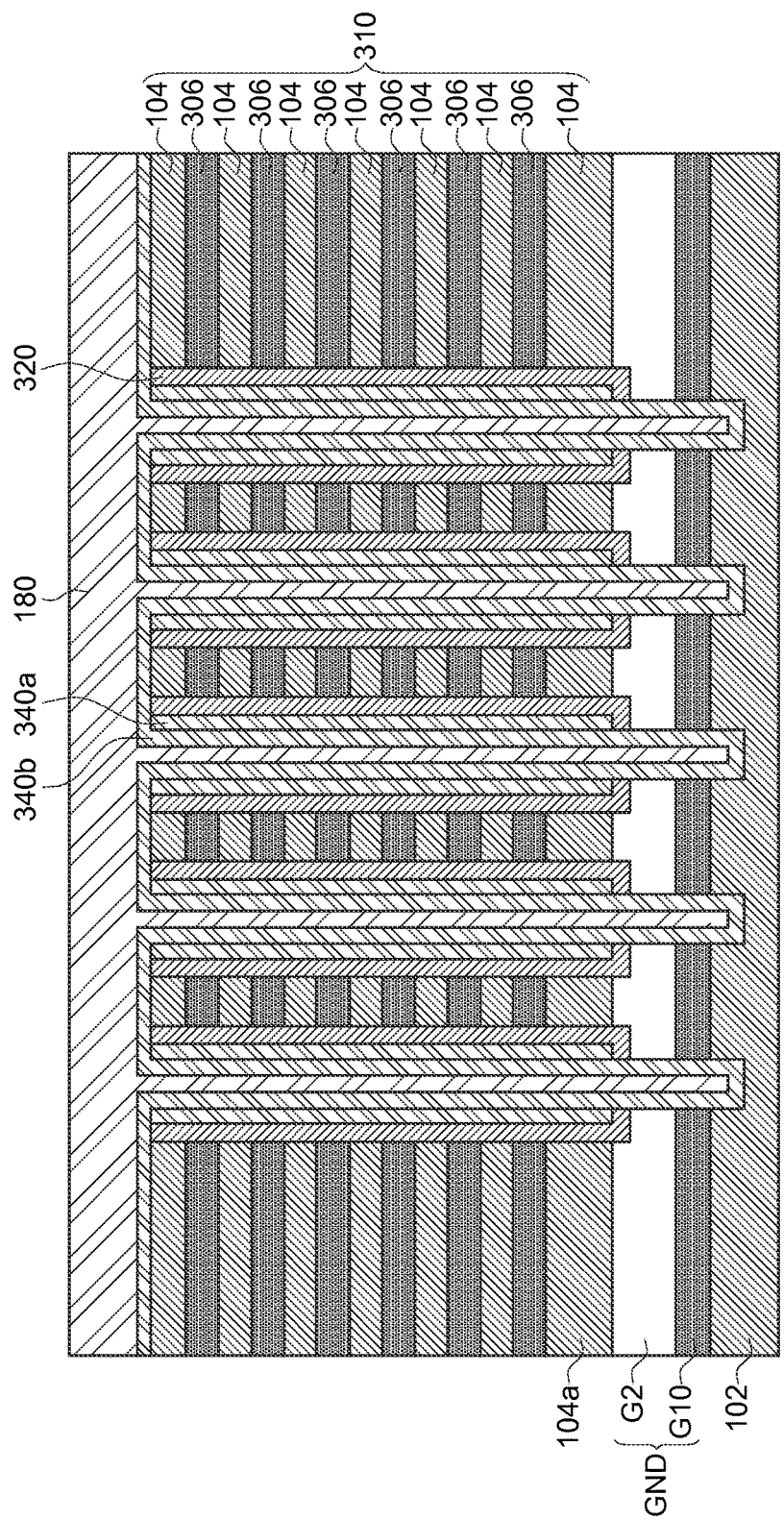

Referring to FIG. 3G, a dielectric material 180 is deposited on the poly-silicon layer 340b. The dielectric material 180 is formed of an oxide, such as silicon dioxide.

Figure 3H:
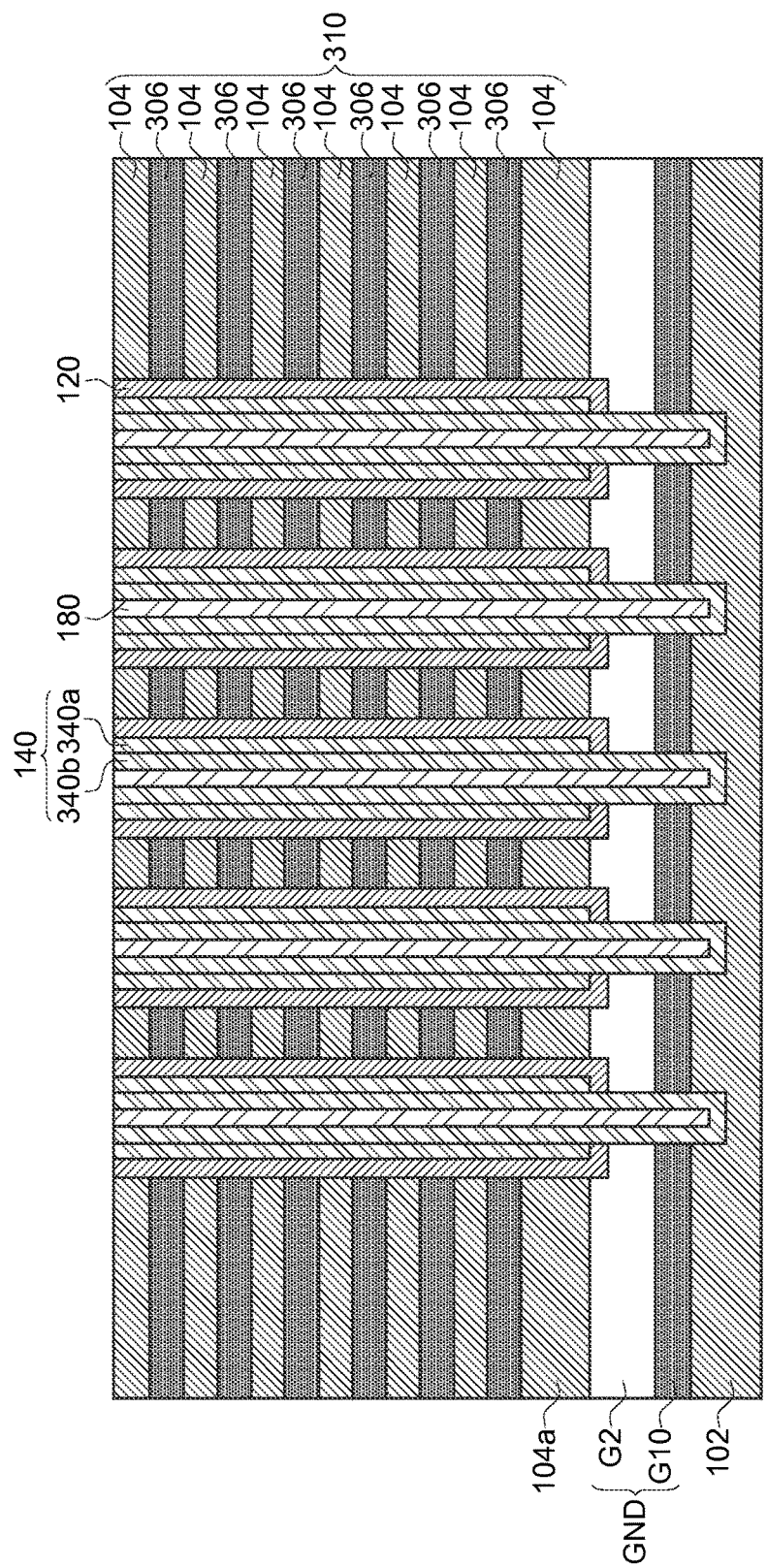

Referring to FIG. 3H, a portion of the poly-silicon layer 340b and the dielectric material 180 higher than the string openings 300 are removed. Thereby, memory layers 120 are formed on the sidewalls of the string openings 300 and channel layers 140 are formed by the remaining poly-silicon covering layer 340a and the poly-silicon layer 340b together.

Figure 3I:
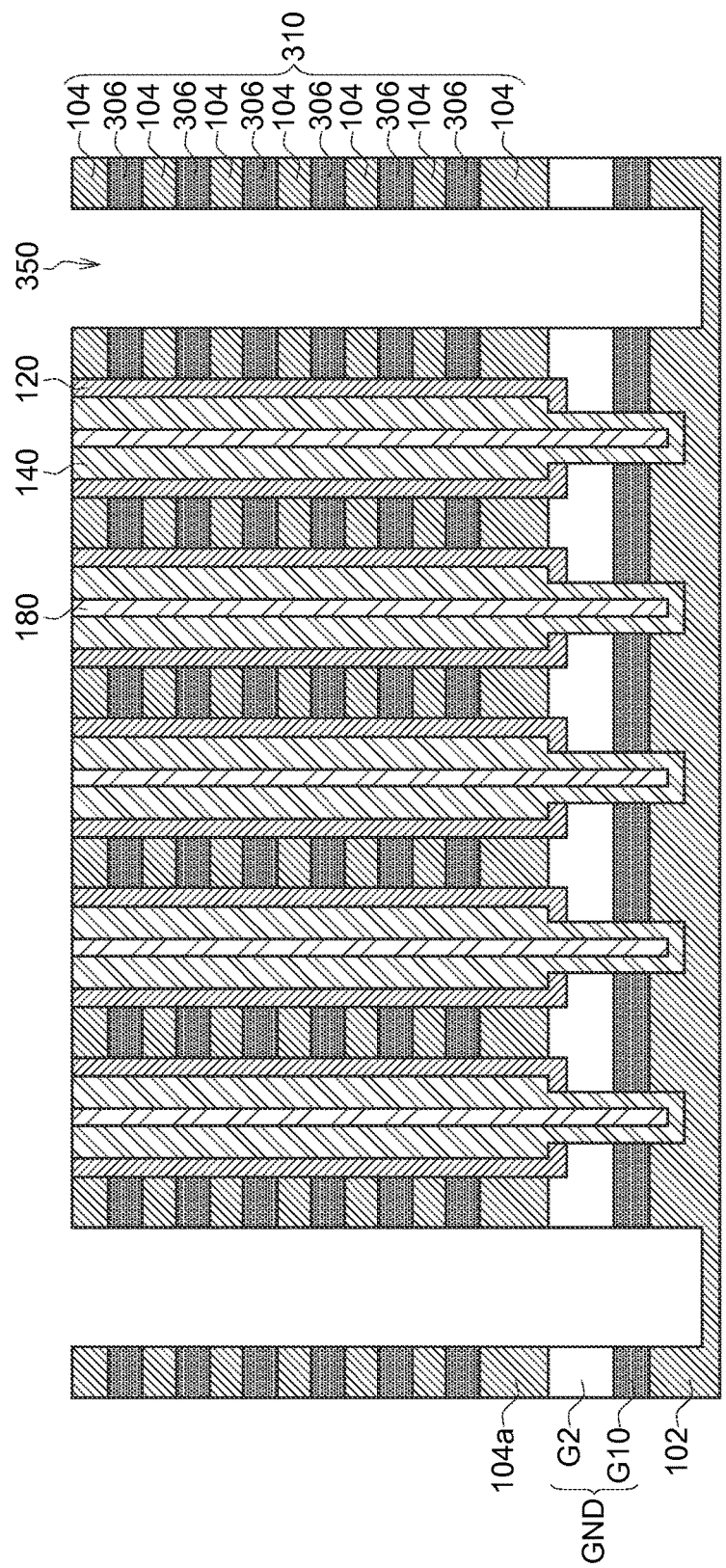

Referring to FIG. 3I, a plurality of etching back openings 350 are formed penetrating through the stacking structure 310 and the first sacrifice layer G10. The etching back opening 350 has a depth larger than a depth formed by the string opening 300 and the via 330.

Figure 3J:
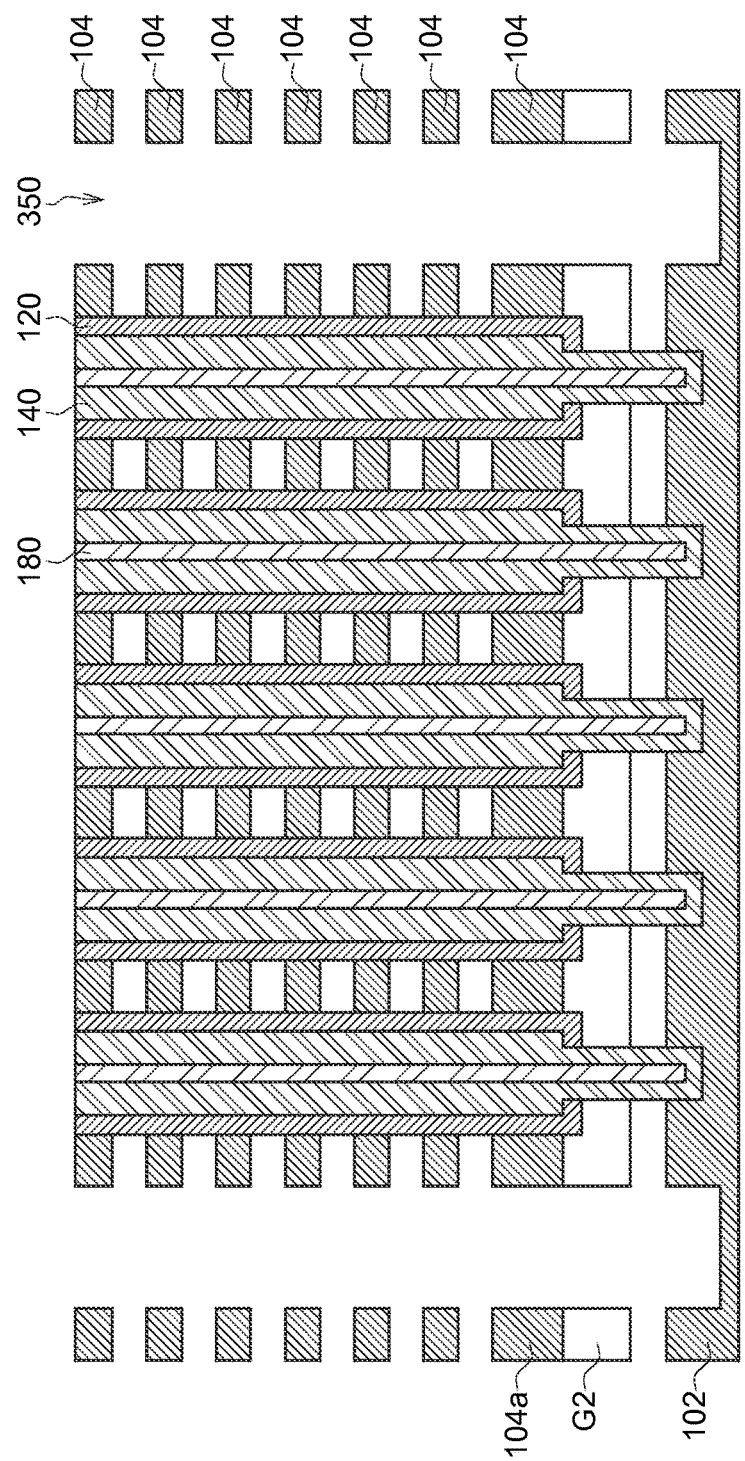

Referring to FIG. 3J, a pull back process is performed to remove the first sacrifice layer G10 and the second sacrifice layer 306 through the etching back openings 350. The pull back process can be an isotropic etching, such as a wet etching method, and can be a highly selective etching, such as selectively etching the silicon nitride without etching the silicon dioxide and poly-silicon.

In this step, because both of the second sacrifice layers 306 and the first sacrifice layer G10 are removed, the entire structure needs to be supported and fixed by the channel layer 140 penetrating through the first sacrifice layer G10 into the substrate 102. It can prevent the stacking structure 310 to be lifted off or moved during the etching back process without using another supporting structure to fix the stacking structure 310.

Figure 3K:
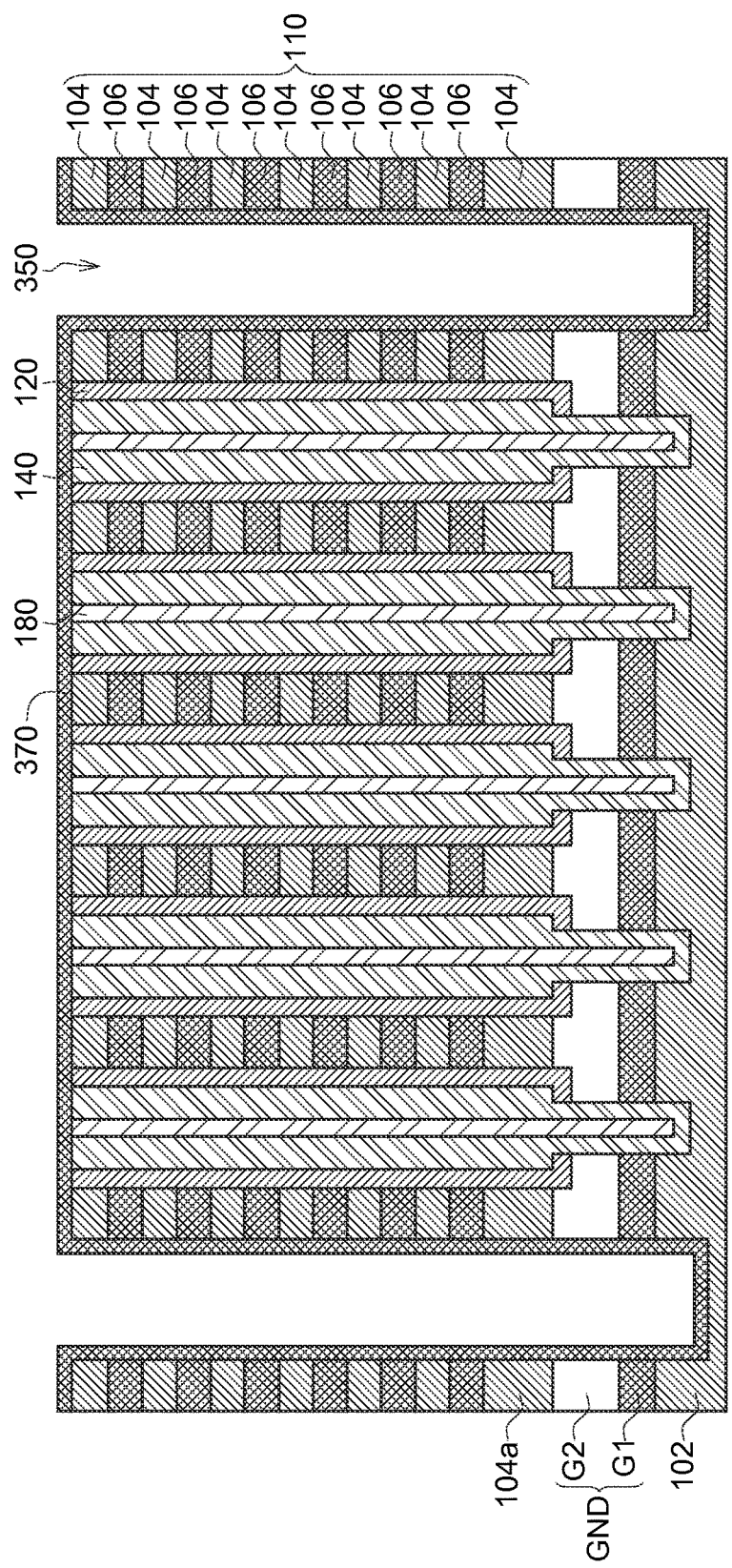

Referring to FIG. 3K, a conductive material 370 is filled in the original positions of the removed second sacrifice layer 306 to form conducting layers 106 disposed between the insulating layers 104, so that a stacking structure 110 is formed by the insulating layers 104 and the conducting layers 106. Besides, a metal layer G1 is formed between the stacking structure 110 and the substrate 102. The conducting layers 106 are adjacent to the memory layers 120, and the metal layer G1 electrically contacts with the channel layers 140. The conductive material 370 preferably includes the metal, such as tungsten (W) or titanium nitride (TiN). In the present embodiment, the conducting layers 106 and the metal layer G1 are concurrently formed.

Figure 3L:
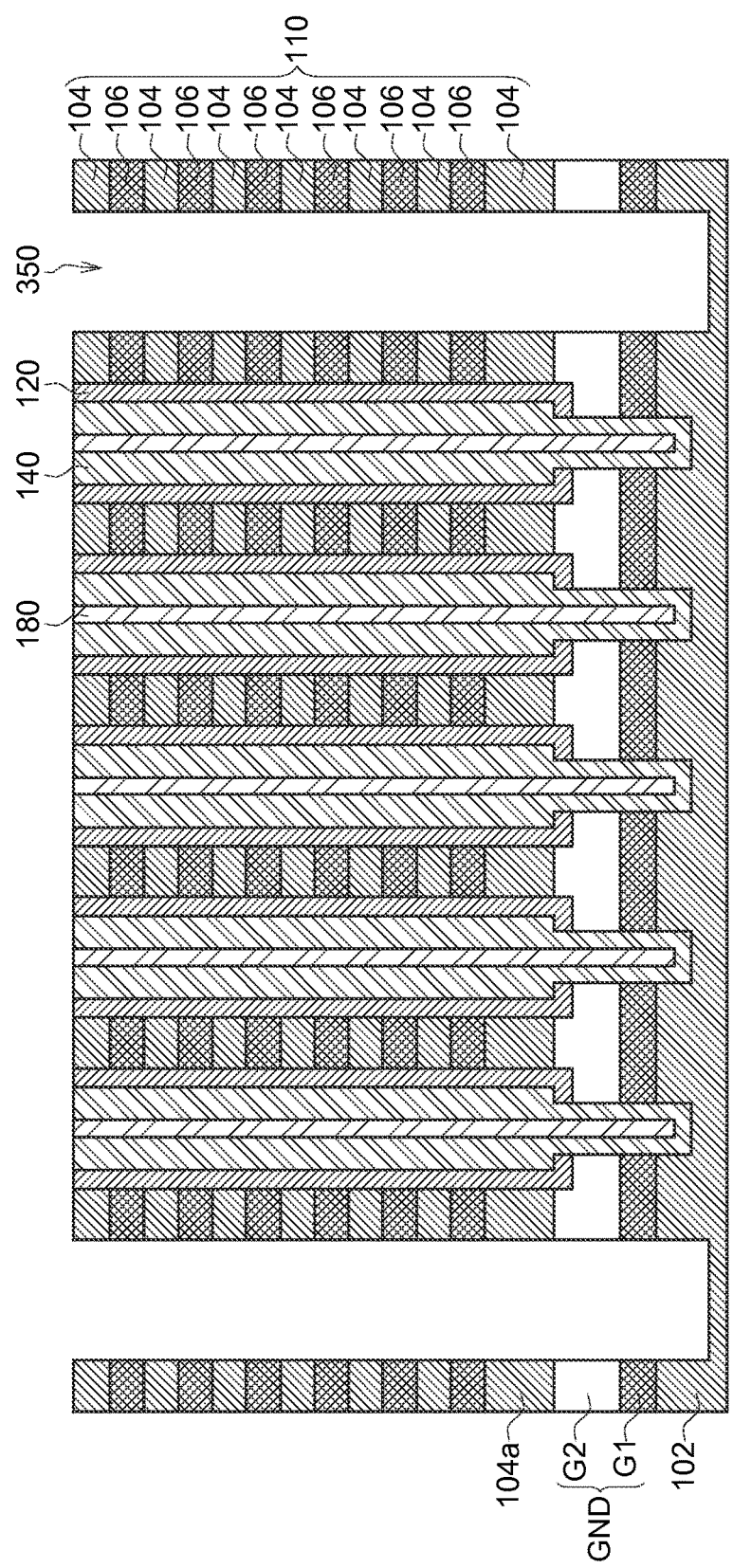

Referring to FIG. 3L, the conductive material 370 higher than the string openings 300 and the conductive material 370 in the etching back openings 350 are removed by an etching method, such as an isotropic etching.

Figure 3M:
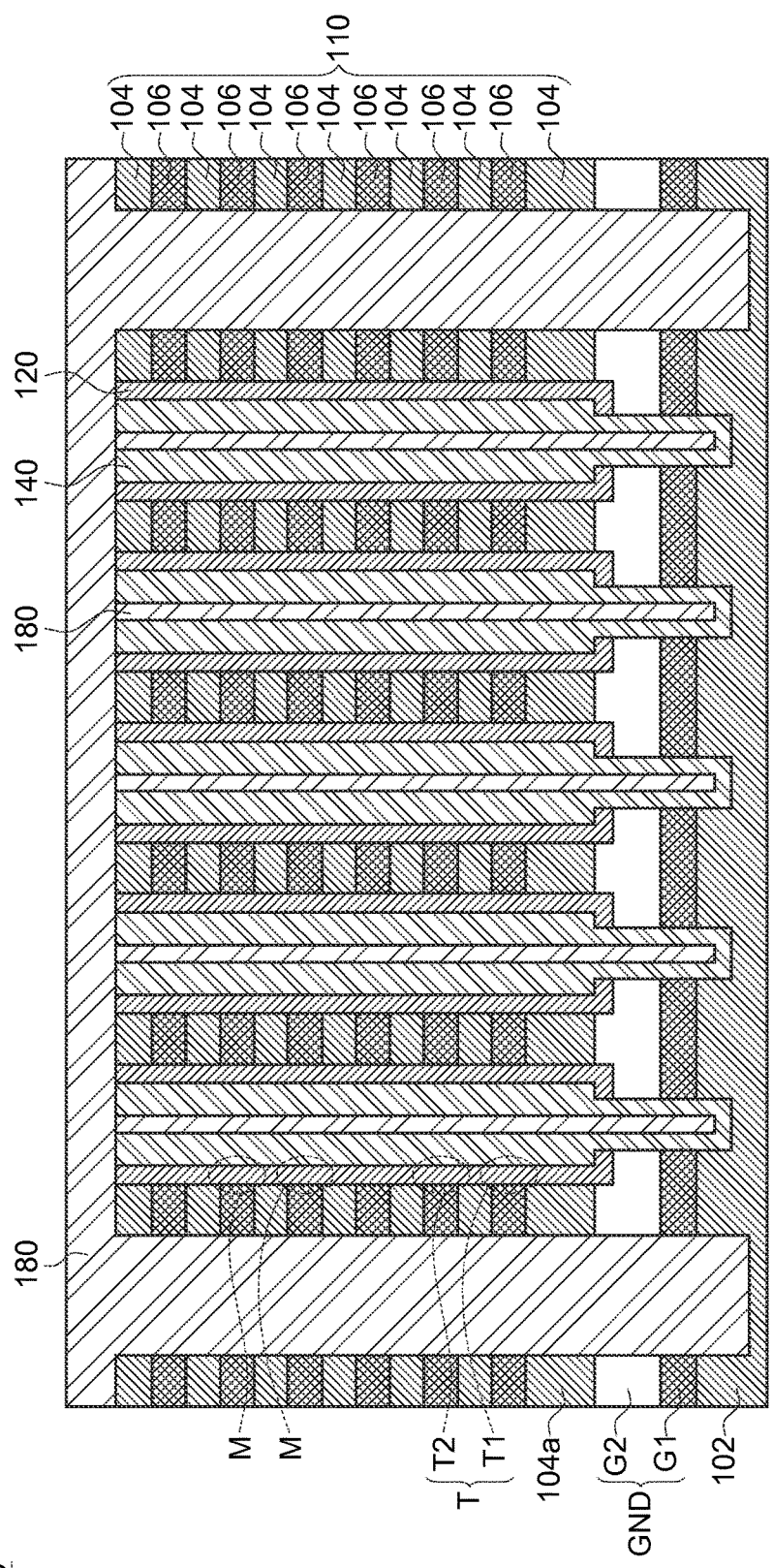

Referring to FIG. 3M, a dielectric material 180 is filled in the etching back openings 350, and covers the stacking structure 110.

Figure 4:
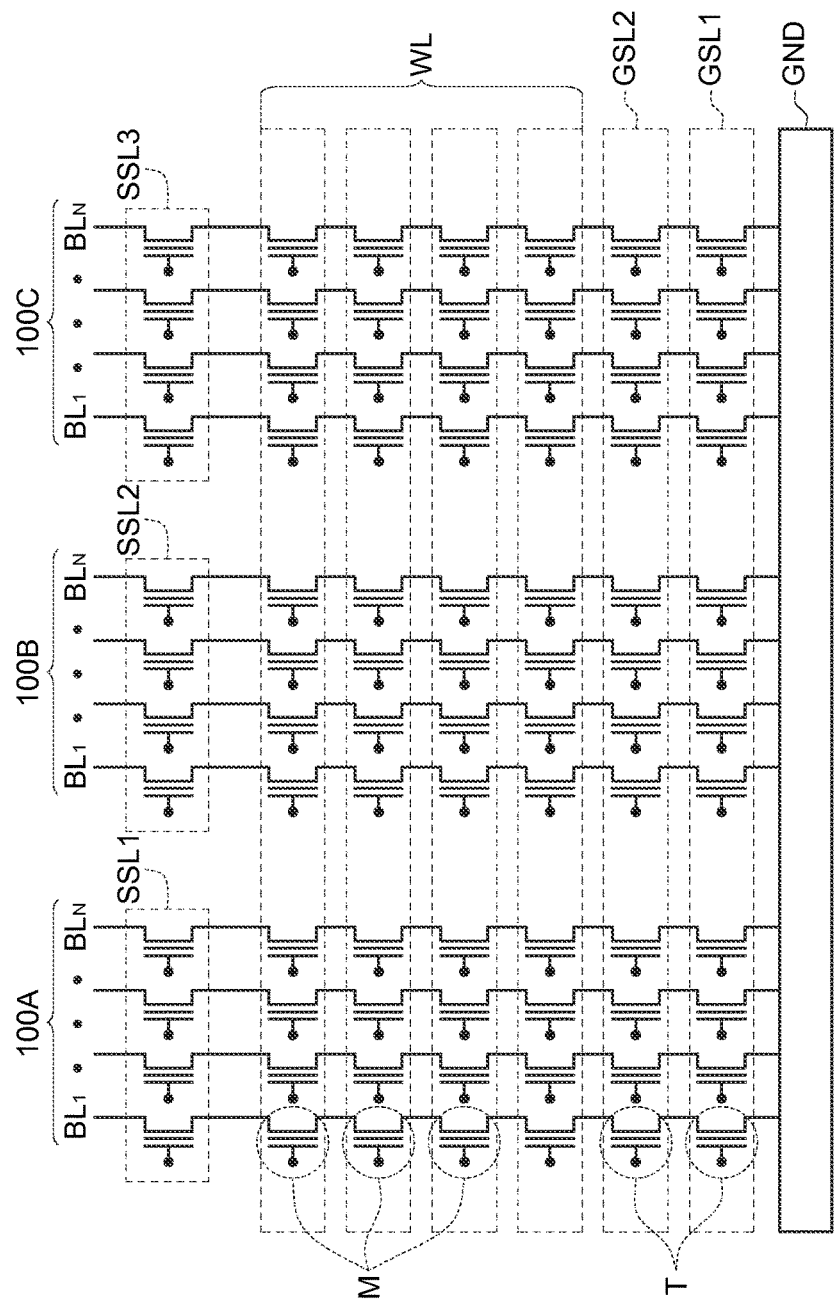
FIG. 4 is an equivalent circuit diagram illustrating a memory device in accordance with one embodiment of the present invention.

FIG. 4 is an equivalent circuit diagram illustrating a memory device in accordance with one embodiment of the present invention.

Referring to FIG. 4, the memory device 10 can include blocks 100A, 100B and 100 C. In the blocks 100A, 100B and 100 C, a plurality of ground selecting lines GSL1 and GSL2 are on the ground layer GND. A plurality of word lines WL are on the ground selecting lines GSL1 and GSL2. A plurality of string selecting lines SSL are on the word lines WL. The string selecting lines SSL1, SSL2 and SSL3 respectively correspond to the blocks 100A, 100B and 100 C. The string selecting lines SSL1, SSL2 and SSL3 respectively connect to a plurality of bit lines $BL_1 \ldots BL_N$. The string selecting lines SSL1, SSL2 and SSL3 electrically connect to the word lines WL and the ground layer GND by a plurality of memory strings 100 respectively. A plurality of memory cells M are formed at the intersections of the memory strings 100 and the word lines WL. A plurality of ground selecting line transistors T are formed at each of the intersections of the memory strings 100 and the ground selecting lines GSL1 and GSL2. The ground selecting line transistors T are connected in series, and have the trapping layer. The ground selecting line transistors T are physically the same as the memory cells M.

According to embodiments described above, a memory device and a method fabricating the same are provided in the present invention. The memory device at least comprises a substrate, a ground layer disposed on the substrate, a stacking structure having a plurality of insulating layers and a plurality of conducting layers alternatively stacked on the ground layer, and a plurality of memory strings. The ground layer includes a metal layer. The memory strings penetrate through the stacking structure and electrically contact with the metal layer.

Because the memory strings penetrate through the stacking structure and electrically contact with the metal layer, the current of the memory cells in the memory strings can be directly transmitted to the metal layer G1 below. Further, the metal layer has a low resistance, so that the formation of the IR drop effect can be avoided. Therefore, the arrangement of the metal contacts between the memory blocks can be decreased, and the layout space of the memory strings can be increased, and the storage space of a SGVC 3D NAND memory device can further be increased.

Optionally, the ground layer can be a multi-layer structure. The ground layer can further include a semiconductor layer disposed on the metal layer. The semiconductor layer can be a heavily doped poly-silicon structure. Since the ground layer has the metal layer, the contact area between the metal layer and the channel layer can produce a schottky barrier, and it may have a negative impact on the stability of the contact resistance. Therefore, the ground layer can be optionally designed as a multi-layer structure. A semiconductor layer can be disposed on the metal layer, so the semiconductor layer can help gathering the current of the memory cells to the metal layer, to improve the stability of the contact resistance.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a substrate;
   a ground layer disposed on the substrate, wherein the ground layer comprises a metal layer;
   a stacking structure having a plurality of insulating layers and a plurality of the conducting layers alternatively stacked on the ground layer; and
   a plurality of memory strings penetrating through the stacking structure and electrically contacting with the metal layer, wherein each of the memory strings comprises:
   a memory layer penetrating through the stacking structure and connected to the conducting layers; and
   a channel layer connected to the memory layer and electrically contacting with the metal layer; and
   a plurality of memory cells formed at a plurality of intersections of the conducting layers and the memory layer, wherein the memory cells are connected to each other by the channel layer.

2. The memory device according to claim 1, wherein the conducting layers and the metal layer are formed of the same metal material.

3. The memory device according to claim 1, wherein each of the memory strings comprises at least one ground selecting line transistor disposed between the memory cells and the ground layer.

4. The memory device according to claim 1, wherein each of the memory strings comprises a plurality of ground selecting line transistors disposed between the memory cells and the ground layer; and the ground selecting line transistors are subjected to different voltages.

5. The memory device according to claim 1, wherein the channel layer penetrates through the metal layer and extends into the substrate.

6. The memory device according to claim 1, wherein the insulating layers have a bottom insulating layer closest to the substrate, and a ratio of a thickness of the bottom insulating layer to a thickness of any one of the insulating layers ranges from 1 to 3.

7. A memory device, comprising:
   a substrate;
   a ground layer disposed on the substrate, wherein the ground layer comprises a metal layer;
   a stacking structure having a plurality of insulating layers and a plurality of the conducting layers alternatively stacked on the ground layer; and
   a plurality of memory strings penetrating through the stacking structure and electrically contacting with the metal layer, wherein the ground layer is a multi-layer structure and the ground layer further comprises:
   a semiconductor layer disposed on the metal layer.

8. The memory device according to claim 7, wherein the semiconductor layer is a heavily doped poly-silicon layer.

9. The memory device according to claim 8, wherein the heavily doped poly-silicon layer has a doping concentration substantially larger than $10^{20}/cm^3$.

* * * * *